(12) United States Patent
Inoue

(10) Patent No.: US 6,656,648 B2
(45) Date of Patent: Dec. 2, 2003

(54) PATTERN INSPECTION APPARATUS, PATTERN INSPECTION METHOD AND MASK MANUFACTURING METHOD

(75) Inventor: Hiromu Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 09/990,357

(22) Filed: Nov. 23, 2001

(65) Prior Publication Data

US 2002/0122990 A1 Sep. 5, 2002

(30) Foreign Application Priority Data

Nov. 24, 2000 (JP) ........................................ 2000-357788

(51) Int. Cl.$^7$ .............................. G03F 9/00; G06K 9/00
(52) U.S. Cl. ............................ 430/30; 430/5; 382/144; 382/149
(58) Field of Search ....................... 430/5, 30; 382/144, 382/145, 149

(56) References Cited

U.S. PATENT DOCUMENTS 5,574,800 A    11/1996   Inoue et al. ................. 382/149

*Primary Examiner*—Christopher G. Young
(74) *Attorney, Agent, or Firm*—Oblon, Spivak, McClelland, Maier & Neustadt, P.C.

(57) ABSTRACT

A pattern inspection device comprises a section for obtaining a sensor data by imaging a pattern formed on an object to be inspected, a reference data creation section to create a reference data obtained from a design data of the pattern, a pattern recognition section for cutting out a predetermined area from the reference data and recognizing the pattern, and a level conversion section for converting a level of one of the reference data and the sensor data according to a recognition result in the pattern recognition section.

12 Claims, 4 Drawing Sheets

FIG. 1B Section profile of reference data
FIG. 1C Section profile of sensor data
FIG. 1D Section profile of level comparison data ((reference data) − (sensor data))

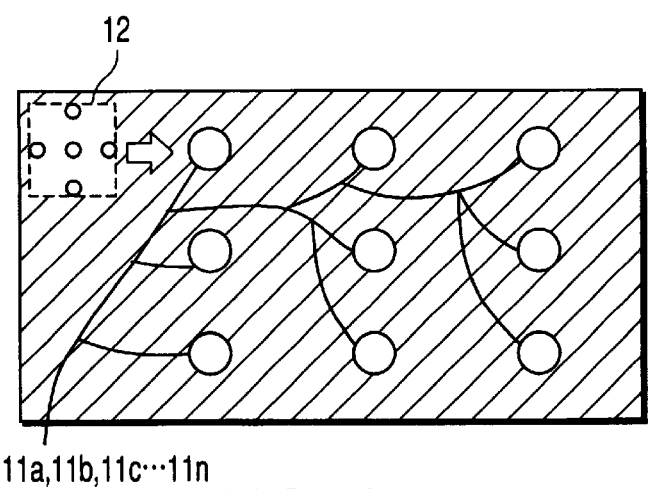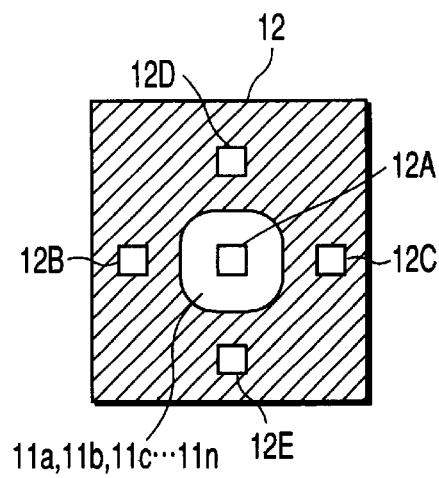
FIG. 3A  FIG. 3B
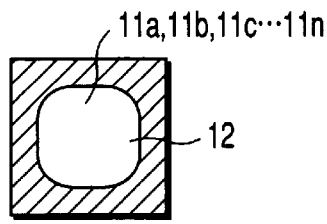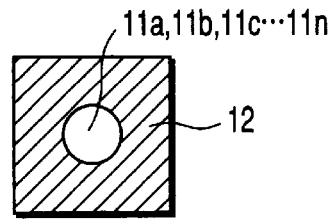
FIG. 4A  FIG. 4B
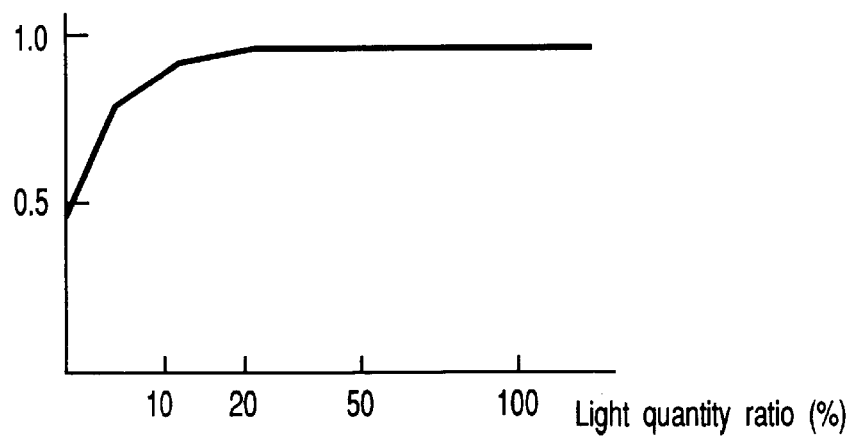
FIG. 5

FIG. 6B  No conversion

FIG. 6C  Conversion

PATTERN INSPECTION APPARATUS, PATTERN INSPECTION METHOD AND MASK MANUFACTURING METHOD

CROSS-REFERENCE TO RELATED APPLICATIONS

This application is based upon and claims the benefit of priority from the prior Japanese Patent Application No. 2000-357788, filed Nov. 24, 2000, the entire contents of which are incorporated herein by reference.

BACKGROUND OF THE INVENTION

1. Field of the Invention

The present invention relates to a pattern defect inspection technique which inspects the presence of the defect of the pattern formed on, for example, photomask etc. The present invention relates to a pattern inspection device and a pattern inspection method to inspect presence of a defect of a pattern, especially a defect of square opening pattern called as a contact pattern and a mask manufacturing method.

2. Description of the Related Art

A usual pattern defect inspection device detects a defect of the pattern to be inspected by comparing the image data of the pattern to be inspected formed on the photomask etc. (Hereinafter, called as a "Sensor data") with the data to which the position data is added to the design data used when the image pattern are designed (Hereinafter, called as a "Reference data").

The configuration of the conventional pattern defect device is described to U.S. Pat. No. 5,574,800, for example.

The defect part of the object to be inspected is output by comparing the sensor data and the reference data obtained with the device described to U.S. Pat. No. 5,574,800 by the comparison circuit. The comparison circuit detects the defect part of the object to be inspected by comparing the sensor data and the reference data and performing the difference arithmetic.

In a word, the comparison circuit detects the defect part of the object to be inspected by obtaining a value obtained by subtracting the sensor data from the reference data, that is, the difference of the level between both data to be compared, and judging the presence of the defect by the threshold value of + and/or − to the result.

However, the above-mentioned conventional pattern defect inspection device has the following problems. The signal level of an opening part obtained by the sensor does not rise to a sufficient bright level according to the influence of the optical resolution, when the square pattern width of the opening of the background becomes small for dark part. With this reason, when the square opening pattern with small pattern width is inspected by the level comparison, a level difference to the reference data is detected though there is no defect. Therefore, when the defect is detected, a normal pattern is mis-recognized as the defect. An example will be specifically explained as follows.

FIG. 1A to FIG. 1D are schematic diagrams to explain the problem in the conventional inspection device. FIG. 1A is a figure which shows the sensor data of the square pattern openings whose widths are 3 $\mu$m, 1 $\mu$m, 0.9 $\mu$m, 0.8 $\mu$m, and 0.7 $\mu$m, respectively.

The sensor data is data in which the image imaged on the sensor face by the optical system of the pattern defect inspection device is electrically converted. Therefore, there is a case that the signal level of an opening part obtained by the sensor does not rise to a predetermined bright level by the influence of optical resolution.

When the section profile is taken at the center of the pattern, in each reference data corresponding to the above-mentioned opening data in FIG. 1B, the signal level of the bright part thereof is constant regardless of the width of the pattern. However, the signal level of the bright part of the sensor data has a tendency to fall as the width of the pattern narrows as shown in FIG. 1C. FIG. 1D is a figure which shows the section profile of the difference between the reference data and the sensor data corresponding to each opening data. In square opening patterns of 0.8 $\mu$m and 0.7 $\mu$m widths whose pattern widths are small as shown in FIG. 1D, a level difference is occurred.

Therefore, even in a normal pattern, the level difference with the reference data is occurred when a square opening pattern whose pattern width is width is inspected even though there is no defect, when the signal levels of the reference data and the sensor data are compared with the level comparison circuit of the pattern defect inspection device. Therefore, there is a disadvantage to mis-recognize the defect pattern even if it is a normal pattern when the defect of the pattern is detected.

BRIEF SUMMARY OF THE INVENTION

According to embodiments of the present invention, a pattern inspection device and a pattern inspection method capable of accurately detecting a pattern defect even by an inspection of a square opening pattern whose pattern width is small and a mask manufacturing method are provided.

A pattern inspection device according to an aspect of present invention is characterized by comprising: means for obtaining a sensor data by imaging a pattern formed on an object to be inspected; reference data creation means for creating a reference data obtained from a design data of the pattern; pattern recognition means for cutting out a predetermined area from the reference data and recognizing a pattern; and level conversion means for converting a level of one of the reference data and the sensor data according to a recognition result in the pattern recognition means.

A pattern inspection method according to an aspect of present invention is characterized by comprising: imaging a pattern formed on an object to be inspected and obtaining a sensor data; obtaining a reference data from a design data of the pattern; recognizing the object to be inspected from the reference data by a recognition window with a plurality of detection points; calculating a light quantity of a recognized pattern of the object to be inspected; and converting a light quantity level of the reference data or the sensor data by using a light quantity of the reference data.

A mask manufacturing method according to an aspect of present invention is characterized by comprising: a step of forming a film on a substrate; a drawing step of drawing the pattern on the film; and a inspection step of inspecting the pattern by comparing a sensor data obtained by imaging the pattern and a reference data obtained from a design data of the pattern, in which the inspection step includes: a substep of recognizing an object to be inspected from the reference data by a recognition window having a plurality of detection points; a substep of calculating a light quantity of a recognized pattern of the object to be inspected; and a substep of converting a light quantity level of the reference data or the sensor data by using a light quantity of the reference data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A to FIG. 1D are schematic diagrams to explain a problem in the conventional pattern defect inspection device;

FIG. 3A is a schematic diagram to explain a method of recognizing a square opening pattern from the reference data and FIG. 3B is an explanation figure of a recognition state by the recognition window;

FIG. 4A and FIG. 4B show the area where the light quantity is calculated for the recognized square opening pattern;

FIG. 5 is a graph of the level conversion coefficient;

FIG. 6A to FIG. 6C are figures to explain a comparison between the section profile of the result of converting the brightness level of the reference data and the section profile of the sensor data;

DETAILED DESCRIPTION OF THE INVENTION

Figure 1A:
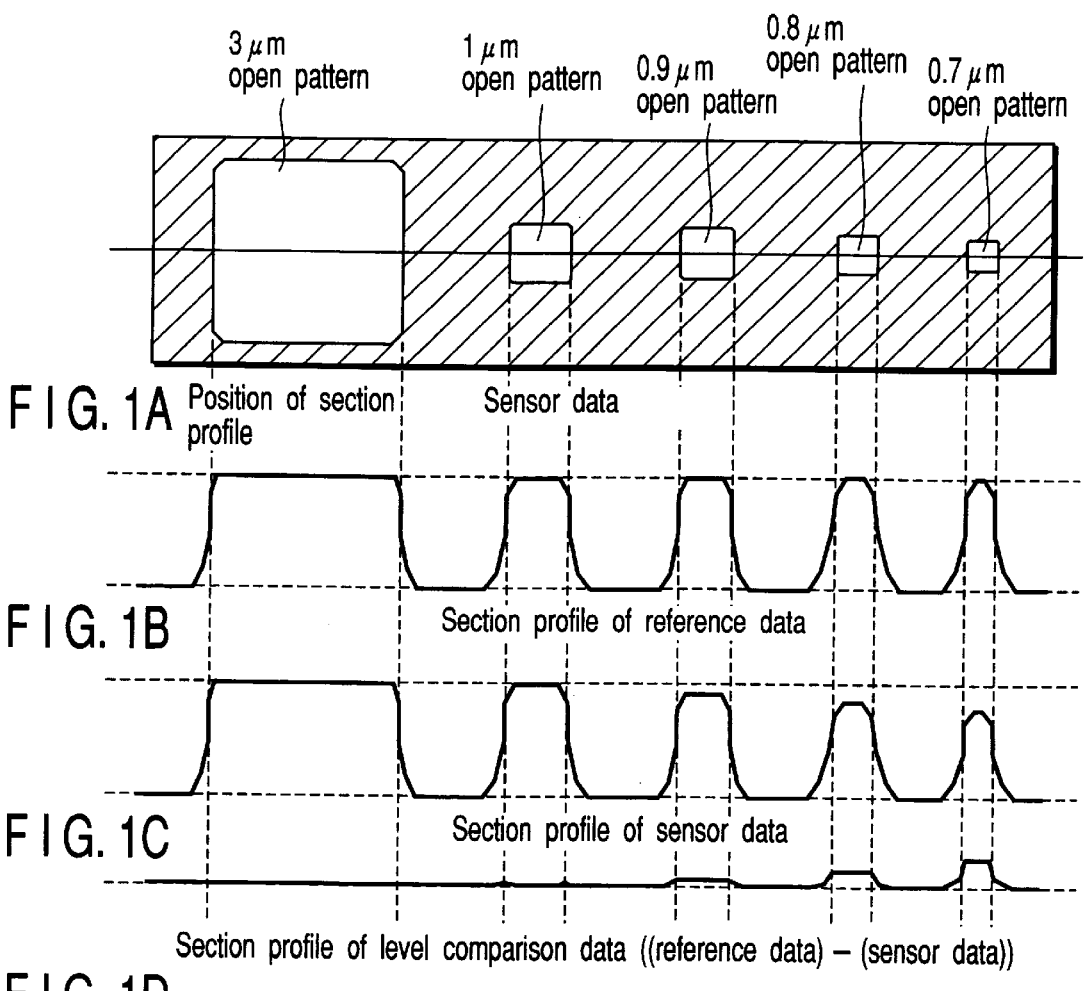

Hereinafter, the pattern inspection device according to an embodiment of the present invention will be explained referring to the drawings.

The pattern defect inspection device detects the defect of the pattern to be inspected by comparing the sensor data with the reference data. The sensor data is an image data of the pattern to be inspected formed on the photomask etc. The reference data is data of the design data etc. used when the image pattern is designed.

Figure 2:
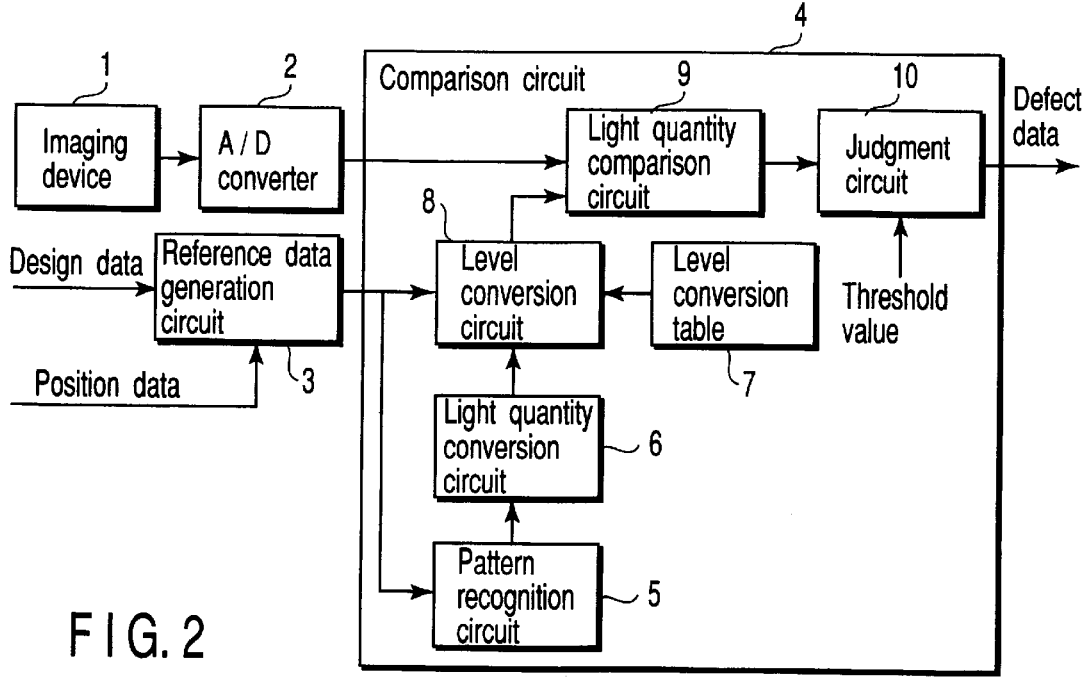
FIG. 2 is a block diagram which shows the configuration of the pattern inspection device according to an embodiment of the present invention.

FIG. 2 is block diagram which shows the configuration of the pattern inspection device according to an embodiment of present invention. The pattern inspection device comprises an imaging device 1, an A/D converter 2, a reference data generation circuit 3, and a comparison circuit 4. To create the sensor data, the imaging device 1 images the pattern of the object to be inspected (a mask and/or a reticle, etc.). The A/D converter 2 is connected with the imaging device 1, and A/D-converts the image signal output from the imaging device 1 to create the sensor data.

The reference data generation circuit 3 inputs the design data to create the reference data, and develops it to a bit pattern. The reference data generation circuit 3 inputs the position data corresponding to the position for taking the image by the imaging device 1, and generates the reference data corresponding to the inspection pattern by using the input position data.

The pattern defect of the object to be inspected is detected by comparing the sensor data with the reference data by the comparison circuit 4.

The comparison circuit 4 comprises a pattern recognition circuit 5, a light quantity summation circuit 6, and a level conversion circuit 8. The pattern recognition circuit 5 recognizes a square pattern from the reference data generated by the reference data generation circuit 3. The light quantity summation circuit 6 is connected with the pattern recognition circuit 5 and adds the light quantity of the reference data of the square pattern which is recognized with the pattern recognition circuit 5. The level conversion circuit 8 is connected with the light quantity summation circuit 6, and converts the level of the reference data based on the light quantity summation result of the reference data in the area recognized with the pattern recognition circuit 5 referring to the conversion data (it may be stored as a "level conversion coefficient") stored in a level conversion table 7. The conversion data stored in the level conversion table 7 connected with the level conversion circuit 8 is created beforehand based on the experiment result.

The sensor data output from the level conversion circuit 8 is input to a light quantity comparison circuit 9. The reference data output from the A/D converter 2 is input to the light quantity comparison circuit 9. The difference arithmetic of which the level difference between the sensor data and the reference data is obtained is performed in the light quantity comparison circuit 9.

The arithmetic result from the light quantity comparison circuit 9 is output to a judgment circuit 10. The judgment circuit 10 compares the arithmetic result with the threshold values set beforehand to detect the defect part.

Next, a method of detecting the defect by the above-mentioned configuration will be explained. FIG. 3A is a schematic diagram to explain the method of recognizing a square opening pattern from the reference data.

The square opening patterns 11a, 11i, 11c, . . . , 11n are recognized as follows. The square opening patterns 11a, 11b, 11c, . . . , 11n are scanned on the reference pattern by using the recognition window 12. It is checked whether the square opening pattern 11a, 11b, 11c, . . . , 11n exists at which position of the reference pattern and the existence thereof is confirmed.

The recognition window 12 is constructed as follows, for example. The recognition window 12 has the five detection points 12A, 12B, . . . , 12E as shown in FIG. 3B. The detection points 12A, 12B, . . . , 12E are constructed by the detection point 12A arranged at the center of the cross and the detection points 12B, . . . , 12E arranged on the vertex of each branch. The distances between the detection point 12A and each of the detection points 12B, . . . , 12E are equal. When the centers of the square opening patterns 11a, 11b, 11c, . . . , 11n agrees with the center of the window (that is, the detection point 12A), the detection points 12B, . . . , 12E are arranged not to overlap the detection points 12B, . . . , 12E to the square opening patterns 11a, 11b, 11c, 11n.

The square opening patterns 11a, 11b, 11c, . . . , 11n are recognized by the recognition window 12 as follows. The brightness of the reference data of the five detection points 12A, 12B, . . . 12E are detected. Then, it is confirmed that it is bright at the detection point 12A of the center and all are dark at four circumference detection points of 12B, 12C, 12D and 12E. It is recognized that the detected data are opening square patterns 11a, 11b, 11c, . . . , 11n, when it is bright at the detection point 12A in the center and all are dark at four circumference detection points 12B, 12C, 12D and 12E. The light quantity of the reference data of the recognized square opening patterns 11a, 11b, 11c, ..., 11n is calculated with the light quantity summation circuit 6. The light quantity summation circuit 6 calculates the sum total of the brightness of the reference data in the predetermined area as the light quantity as follows.

FIG. 4A and FIG. 4B are explanation figures when the light quantity is calculated for two kinds of opening patterns with different sizes of square opening patterns 11a, 11b, 11c, ..., 11n recognized by the window 12. The amount of the light quantity for two kinds of patterns is changed according to the size of the square opening patterns 11a, 11b, 11c, ..., 11n. That is, the light quantity with a large pattern becomes large in a case of the square opening patterns 11a, 11b, and 11c, ..., 11n shown in FIG. 4A, and the light quantity with a small pattern becomes small in a case of the square opening patterns 11a, 11b, 11c, ..., 11n shown in FIG. 4B.

The result calculated with the light quantity summation circuit 6 is transferred to the level conversion circuit 8. The level conversion circuit 8 corrects the brightness of the sensor data to be suitable for the brightness of the reference data based on the value of the transferred light quantity. This correction converts the brightness of the input reference data by the level conversion table 7 based on the light quantity ratio (=(light quantity)/(measurement area)).

FIG. 5 is an example for graphing the level conversion table 7 shown in FIG. 2. The level conversion table 7 is created by collecting data obtained by the experiment. In the experiment, the imaging is performed by using, for example, a mercury lamp whose wavelength is 365 nm as the light source and using a CCD line sensor imaged by the objective lens of NA 0.75. According to FIG. 5, the level conversion coefficient becomes small become 1.0 or less from a point where the light quantity summation result becomes about 20%, and the value of the level conversion coefficient is set that the smaller the light quantity summation result is, the smaller the value of the level conversion coefficient is.

The level conversion coefficient of the reference data is obtained as an example by the level conversion table 7 based on the light quantity summation result output from the light quantity summation circuit 6. As shown in FIG. 5, the level conversion coefficient becomes 1.0, 1.0, 0.78, and 0.65 respectively for an opening pattern opened by the rectangles whose side lengths of the patterns are 3 μm, 1 μm, 0.8 μm, and 0.7 μm, respectively.

Figure 6A:
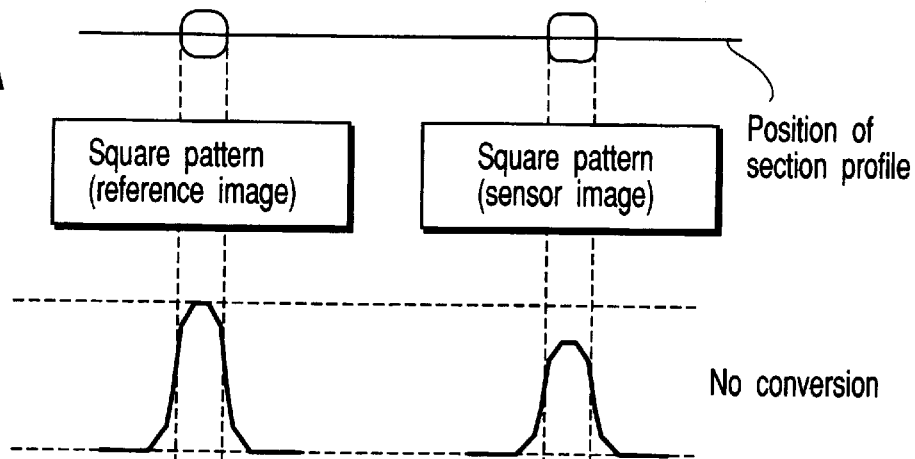

FIG. 6A to FIG. 6C are explanation figures which compare the section profile of the result of converting the brightness level of the reference data shown in FIG. 6C of (a) with the section profile of the sensor data shown in FIG. 6C of (b) by the level conversion by the level conversion circuit 8.

In this case, as shown in FIG. 6C of (a), the result of converting the brightness level of the reference data and the light quantity with the sensor data of FIG. 6C of (b) are compared. And, it is judged that it is the defect as the defect judgment of the transmittance when the difference of the light quantity is larger than that of a constant threshold value. Therefore, the defect can be accurately judged.

In the above-mentioned embodiment, the sensor data is compared after converting the brightness level of the reference data with the level conversion circuit 8, but the brightness level of the sensor data may be converted referring to the level conversion table 7, the reference data may be made the state as it is.

Figure 7A:
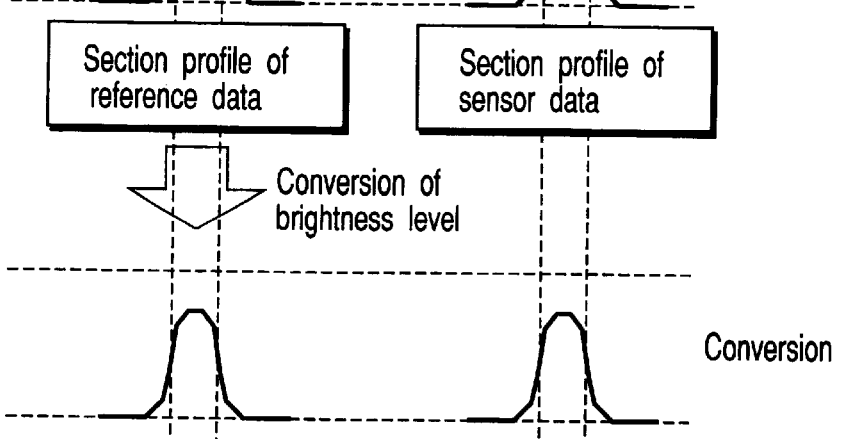
FIG. 7A to FIG. 7C are examples of the object to be inspected.
Figure 7A:
Figure 7A:
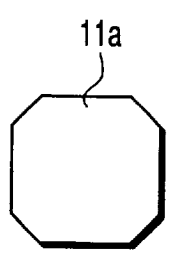
Figure 7B:
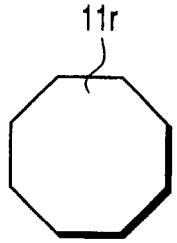
Figure 7C:
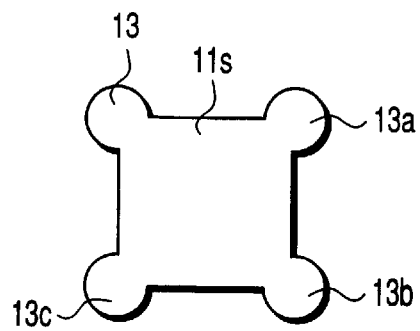

In the above-mentioned explanation, it is explained by using a square opening pattern as the pattern to be inspected, but the shape of an opening pattern is not limited to this. For example, it is possible to perform the similar judgment for a square opening pattern 11q whose corner is rounded as shown in FIG. 7A, a circle opening pattern 11r shown in FIG. 7B, and a square opening pattern 11s to which small auxiliary patterns 13a, 13b, 13c, and 13d called as a serif is further added as shown in FIG. 7C, etc.

The recognition window 12 is not limited to the above-mentioned embodiment, and it is possible to use the various shapes and the sizes as the recognition window 12. In the above-mentioned embodiment, the pattern in which the five detection points 12A, 12B, ..., 12E are arranged at a position where the square opening patterns 11a, 11b, 11c, ..., 11n are not overlapped is used, when a center point on arrangement on the cross is equal distance to center points of each branch and center points of the square opening patterns 11a, 11b, 11c, ..., 11n agree with the center of recognition window 12. For example, since recognition window 12 can change the optical magnification, the size can be properly changed according to the size of the object to be inspected.

The arrangement of the number of the detection point 12A, 12B, ..., 12E of recognition window 12 may be employed besides the arrangement and the number to which the five detection points 12A, 12B, ..., 12E on the above-mentioned cross. For example, it is possible to perform by an arrangement of four detection points of which the detection points are provided at the center of three branches and each tip of each branch (i.e., 3 pieces). It is also possible to detect the defect by providing the plurality of detection points on the tip of each branch respectively. In addition, the detection point is not provided on the tip of each branch, for example, the detection point is made to stripe and the stripe may be arranged in an annular shape, a square ring.

Figure 8:
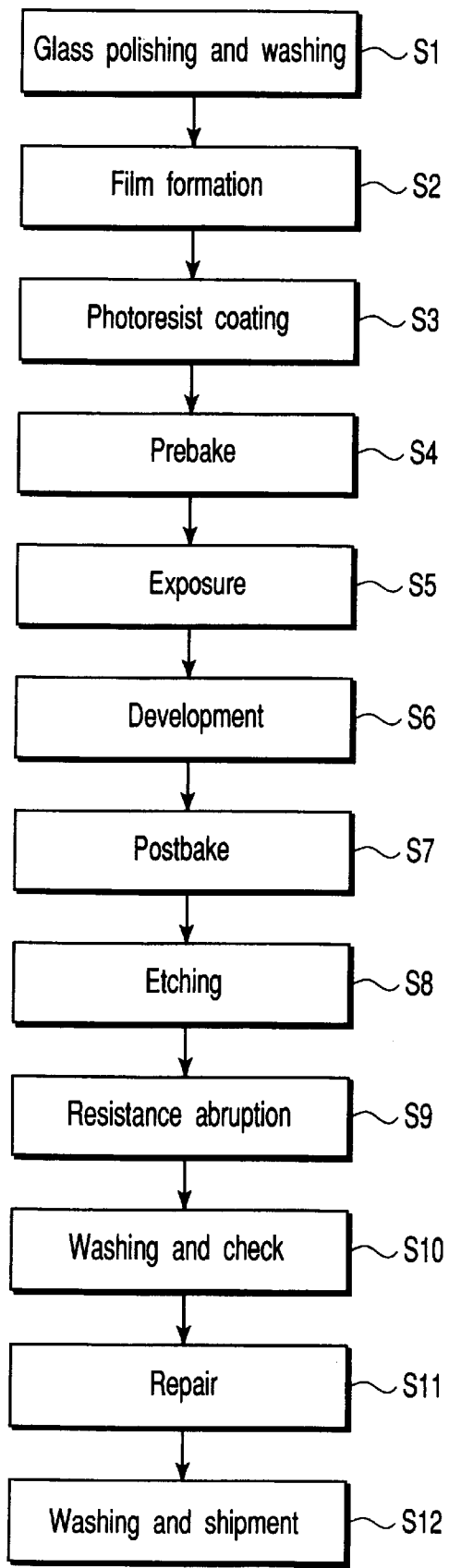
FIG. 8 is a flow chart which shows the manufacturing process of a hard mask.

Next, the manufacturing method of the hard mask which is an example of the object to be inspected will be explained. FIG. 8 is a flow chart which shows the manufacturing process of the hard mask.

The hard mask forms the photomask by making the image of the metal or the metallic oxide layer on the glass substrate to remove the relief effect of the soft mask and overcome the weakness of the film intensity.

First, the glass substrate is polished and washed (step S1), and the chrome film of the thickness of about 50 to 300 μm is formed on the glass substrate by the sputtering method of the vacuum evaporation (step S2). Next, usually, the photoresist of about 0.4 to 0.8 μm in the resist film thickness is coated (step S3). After pre-bake (step S4), the exposure is performed according to the formed pattern (step S5). Subsequently, the development is performed with the automatic development device etc. by the spray method and the soaking method (step S6). After development, post-baking is performed (step S7). In the post-baking, since the resist causes the plastic flow (softening phenomenon) when the temperature is too high, it is necessary to notice the management of the temperature and the time setting. Next, the etching is performed (step S8). In the etching, the processing is easy by using the soaking method as a wet method. But there is a disadvantage that the undercut is 0.5 μm or more and the size of the line becomes thinner than the width of the resist line. Therefore, the dry etching method such as the plasma etchings and sputter etching is often used for the etching. Next, the resist is removed (step S9), washing is performed, thereafter, and each inspection is performed (step S10). In the pattern inspection in this case, the above-mentioned pattern inspection according to the present invention is used.

Thereafter, when the defect is found, the defect is corrected (step S11), washing is performed after correction, and shipping is performed (step S12).

The above-mentioned manufacturing process is one example, and it is possible to perform the manufacturing in the modified various processes.

The accurate detection can be performed by canceling the disadvantage of the level difference, which is disadvantage in the conventional pattern inspection device, between the sensor data and the reference data caused when inspecting the square opening pattern whose pattern width is small to raise the defect detection sensitivity of the transmittance etc.

The pattern inspection device using the above-mentioned pattern inspection method can accurately detect a minute defect of the object to be inspected.

In addition, the mask manufactured by the mask manufacturing method according to the embodiment can be used in the semiconductor manufacturing process etc. as an excellent mask having no defect.

According to the above-mentioned embodiment, since the disadvantage of the level difference of the sensor data and the reference data compared therewith can be canceled, the mis-recognition when detecting the defect is canceled and the accurate detection can be performed.

The following inventions can be derived from the above-mentioned embodiments.

A pattern inspection device according to an aspect of the present invention comprises means for obtaining a sensor data by imaging a pattern formed on an object to be inspected; reference data creation means for creating a reference data obtained from a design data of said pattern; pattern recognition means for cutting out a predetermined area from said reference data and recognizing a pattern; and level conversion means for converting a level of one of said reference data and said sensor data according to a recognition result in said pattern recognition means.

In the above-mentioned pattern inspection device, the following manners are preferable. The following manners may be applied solely and/or may be applied by properly combining them.

(1) Light quantity summation means for adding a light quantity in a predetermined area of a pattern recognized by said pattern recognition means is further provided, and said level conversion means converts one of levels of said reference data and said sensor data by a summation result in said light quantity summation means.

(2) The level conversion of said reference data or said sensor data is performed by using a level conversion coefficient stored in a level conversion table obtained beforehand.

(3) Level comparison means for comparing said reference data and said sensor data converted by said level conversion means; and judgment means for judging a presence of a defect by a comparison result in said level comparison means are further provided.

(4) The pattern recognition means includes means for recognizing a pattern by using a recognition window.

(5) In (4), said recognition window has a plurality of detection windows.

(6) In (5), a plurality of detection windows of said recognition window include a detection window allocated at a center position and a plurality of detection windows allocated at surroundings thereof.

(7) In (5), a plurality of detection windows of said recognition window includes a detection window allocated at a center position and a belt-shaped detection window allocated to surround surroundings thereof.

A pattern inspection method according to an aspect of the present invention comprises imaging a pattern formed on an object to be inspected and obtaining a sensor data; obtaining a reference data from a design data of said pattern; recognizing the object to be inspected from said reference data by a recognition window with a plurality of detection points; calculating a light quantity of a recognized pattern of the object to be inspected; and converting a light quantity level of said reference data or said sensor data by using a light quantity of said reference data.

In the above-mentioned pattern inspection device, the following manners are preferable. The following manners may be applied solely and/or may be applied by properly combining them.

(1) Comparing the reference data to which said level is converted with the sensor data to which the level are not converted, or the reference data to which said level is not converted with the sensor data to which the level are converted; and inspecting a defect by said comparison result are further provided.

(2) A sum total of brightness in a predetermined area is calculated as the light quantity of the object to be inspected.

A mask manufacturing method according to an aspect of the present invention comprises a step of forming a film on a substrate; a drawing step of drawing the pattern on said film; and a inspection step of inspecting said pattern by comparing a sensor data obtained by imaging said pattern and a reference data obtained from a design data of said pattern, and said inspection step includes: a substep of recognizing an object to be inspected from said reference data by a recognition window having a plurality of detection points; a substep of calculating a light quantity of a recognized pattern of the object to be inspected; and a substep of converting a light quantity level of said reference data or said sensor data by using a light quantity of said reference data.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A pattern inspection device comprising:
   means for obtaining a sensor data by imaging a pattern formed on an object to be inspected;
   reference data creation means for creating a reference data obtained from a design data of said pattern;
   pattern recognition means for cutting out a predetermined area from said reference data and recognizing a pattern; and
   level conversion means for converting a level of one of said reference data and said sensor data according to a recognition result in said pattern recognition means.

2. The pattern inspection device according to claim 1, further comprising
   light quantity summation means for adding a light quantity in a predetermined area of a pattern recognized by said pattern recognition means, wherein
   said level conversion means converts one of levels of said reference data and said sensor data by a summation result in said light quantity summation means.

3. The pattern inspection device according to claim 1, wherein the level conversion of said reference data or said sensor data is performed by using a level conversion coefficient stored in a level conversion table obtained beforehand.

4. The pattern inspection device according to claim 1, further comprising:

level comparison means for comparing said reference data and said sensor data converted by said level conversion means; and judgment means for judging a presence of a defect by a comparison result in said level comparison means.

5. The pattern inspection device according to claim 1, wherein said pattern recognition means includes means for recognizing a pattern by using a recognition window.

6. The pattern inspection device according to claim 5, wherein said recognition window has a plurality of detection windows.

7. The pattern inspection device according to claim 6, wherein a plurality of detection windows of said recognition window include a detection window allocated at a center position and a plurality of detection windows allocated at surroundings thereof.

8. The pattern inspection device according to claim 6, wherein a plurality of detection windows of said recognition window includes a detection window allocated at a center position and a belt-shaped detection window allocated to surround surroundings thereof.

9. A pattern inspection method comprising:

imaging a pattern formed on an object to be inspected and obtaining a sensor data;

obtaining a reference data from a design data of said pattern;

recognizing the object to be inspected from said reference data by a recognition window with a plurality of detection points;

calculating a light quantity of a recognized pattern of the object to be inspected; and converting a light quantity level of said reference data or said sensor data by using a light quantity of said reference data.

10. The pattern inspection method according to claim 9, further comprising:

comparing the reference data to which said level is converted with the sensor data to which the level are not converted, or the reference data to which said level is not converted with the sensor data to which the level are converted; and inspecting a defect by said comparison result.

11. The pattern inspection method according to claim 9, wherein a sum total of brightness in a predetermined area is calculated as the light quantity of the object to be inspected.

12. A mask manufacturing method comprising:

a step of forming a film on a substrate;

a drawing step of drawing the pattern on said film; and an inspection step of inspecting said pattern by comparing a sensor data obtained by imaging said pattern and a reference data obtained from a design data of said pattern, wherein said inspection step includes:

a substep of recognizing an object to be inspected from said reference data by a recognition window having a plurality of detection points;

a substep of calculating a light quantity of a recognized pattern of the object to be inspected; and a substep of converting a light quantity level of said reference data or said sensor data by using a light quantity of said reference data.

* * * * *